United States Patent
Doetsch et al.

(10) Patent No.: US 6,574,291 B2
(45) Date of Patent: Jun. 3, 2003

(54) TURBO-CODE DECODER AND TURBO-CODE DECODING METHOD WITH ITERATIVE CHANNEL PARAMETER ESTIMATION

(75) Inventors: Markus Doetsch, Schliern (CH); Tideya Kella, München (DE); Peter Schmidt, Erpolzheim (DE); Peter Jung, Otterberg (DE); Joerg Plechinger, München (DE); Michael Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/085,964

(22) Filed: Feb. 28, 2002

(65) Prior Publication Data

US 2003/0007579 A1 Jan. 9, 2003

Related U.S. Application Data

(63) Continuation of application No. PCT/DE00/04328, filed on Dec. 4, 2000.

(30) Foreign Application Priority Data

Dec. 9, 1999 (DE) ......................... 199 59 409

(51) Int. Cl.[7] .................. H04L 27/06; H03M 13/03
(52) U.S. Cl. ...................... 375/341; 714/786
(58) Field of Search .............................. 375/262, 265, 375/316, 341; 714/786, 787, 788

(56) References Cited

U.S. PATENT DOCUMENTS

| | | | |
|---|---|---|---|
| 5,265,122 A | 11/1993 | Rasky et al. | |
| 5,905,742 A | 5/1999 | Chennakeshu et al. | |
| 5,907,582 A | 5/1999 | Yi | |
| 5,970,085 A | * 10/1999 | Yi | 370/342 |
| 5,983,385 A | * 11/1999 | Khayrallah et al. | 714/755 |
| 6,061,387 A | * 5/2000 | Yi | 375/142 |
| 6,094,427 A | 7/2000 | Yi | |
| 6,263,467 B1 | * 7/2001 | Hladik et al. | 714/755 |
| 6,307,901 B1 | * 10/2001 | Yu et al. | 375/341 |

FOREIGN PATENT DOCUMENTS

| | | |
|---|---|---|
| DE | 197 36 625 C1 | 12/1998 |
| DE | 199 02 100 A1 | 8/2000 |
| WO | WO 99/09696 | 2/1999 |

OTHER PUBLICATIONS

Chin–Liang Wang et al., "Performance of Turbo Codes in Rayleigh Fading Channels with Adaptive Channel Estimation," 2000, IEEE, pp. 1665–1669.*
Claude Berrou et al.: "Near Shannon Limit Error—Correcting Coding And Decoding: Turbo–Codes (1)", Proc. IEEE Int. Conf. On Communications ICC'93, Genoa, 1993, pp. 1064–1070.
Peter Jung: "Analyse und Entwurf digitaler Mobilfunksysteme" [analysis and design of digital mobile radio systems], B.G. Teubner, Stuttgart, 1997, pp. 343–361.
Sven Riedel: "Iterative Decodierung parallel verketteter binärer Faltungscodes" [iterative decoding of parallel chain binary convolution codes], VDI Fortschrittberichte, VDI Verlag, Düsseldorf, 1997, Series 10, No. 498, pp. 44–51.

* cited by examiner

*Primary Examiner*—Tesfaldet Bocure
(74) *Attorney, Agent, or Firm*—Laurence A. Greenberg; Werner H. Stemer; Ralph E. Locher

(57) ABSTRACT

A turbo-code decoder with iterative channel parameter estimation for decoding turbo-coded received data that includes systematic information data and redundant data. The turbo-code decoder includes a weighting circuit for weighting the turbo-coded received data with at least one estimated channel parameter. Estimated value data is generated. A turbo-code coding circuit turbo-codes the generated estimated value data. A comparison circuit compares the turbo-coded estimated value data with the turbo-coded received data, and depending on the result of the comparison, iteratively sets the estimated channel parameter(s) in order to weight the turbo-coded received data.

7 Claims, 3 Drawing Sheets

TURBO-CODE DECODER AND TURBO-CODE DECODING METHOD WITH ITERATIVE CHANNEL PARAMETER ESTIMATION

CROSS-REFERENCE TO RELATED APPLICATION

This application is a continuation of copending International Application No. PCT/DE00/04328, filed Dec. 4, 2000, which designated the United States.

BACKGROUND OF THE INVENTION

Field of the Invention

The invention relates to a turbo-code decoder and a turbo-code decoding method with iterative channel parameter estimation, in particular for the mobile radiotelephone field.

In recent times, binary parallel-concatenated, recursive, systematic convolution codes, referred to as turbo codes, have been used for channel coding. Substantially improved error protection can be achieved by using turbo codes instead of convolution codes, in particular for transmitting large blocks of data bits. The idea on which the turbo code is based entails the concatenation of at least two binary, recursive, systematic convolution coders (RSC coders) using turbo-code interleaving devices. The RSC coders generate redundant data strings. The coding is interleaved by the coders in blocks in the turbo coder. The output data string of the turbo coder contains the original input data string an systematic information, and in addition, the redundant data as non-systematic information. The structure of a conventional coder is described in detail, for example, in "Analyse und Entwurf digitaler Mobilfunksysteme" [*Analysis and design of digital mobile radio systems*] by Dr. Peter Jung, Teubner Verlag, Stuttgart, 1997, pp. 334–348.

The turbo-coded data are output by a transmitter and are forwarded via a data channel to a receiver that contains a turbo-code decoder. The turbo-code decoder reverses the coding performed in the turbo coder and outputs estimated received data values that are intended to correspond as closely as possible to the original data string coded by the turbo-code coder. However, the data transmission channel or channel path is not stable, but is subject to fluctuations. Using the received data, it is possible to estimate the channel condition of the data transmission channel. Specific channel parameters are determined here. The more accurate the estimate of the transmission channel condition, the lower the bit error ratio will be.

FIG. 1 shows a prior art turbo-code reception circuit.

The turbo-coded received data contain systematic information data x and redundant data y. The coded received data are fed to an equalizer that outputs the equalized turbo-coded received data to a circuit for channel parameter estimation, which weights the equalized turbo-coded received data depending on the determined channel parameters and outputs them to a turbo-code decoder. The turbo-code decoder forwards the turbo decoding of the weighted, systematic and redundant received data and outputs an estimated value data string for further data processing.

The problem with the arrangement shown in FIG. 1 is that only one channel parameter estimation is carried out for each received data block by the circuit that is used for channel parameter estimation and weighting of the received data. However, since the transmission channel can fluctuate severely, particularly in the mobile radio field, due to the effects of interference, the determined estimated channel parameter values are so inaccurate that they produce an inadequate system response when used in the turbo-code decoder, thereby increasing the bit error rate.

SUMMARY OF THE INVENTION

It is accordingly an object of the invention to provide a turbo-code decoder and a turbo-code decoding method which overcome the above-mentioned disadvantages of the prior art apparatus and methods of this general type.

In particular, it is an object of the invention to provide a turbo-code decoder and a turbo-code decoding method in which the channel parameters are iteratively and continuously re-estimated in order to respond quickly to fluctuations in the transmission channel, and thus to reduce the bit error rate.

With the foregoing and other objects in view there is provided, in accordance with the invention, a turbo-code decoder with iterative channel parameter estimation for decoding turbo-coded received data that includes systematic information data and redundant data. The turbo-code decoder includes: a weighting circuit for weighting turbo-coded received data with at least one estimated channel parameter; a first channel decoder for generating reliability information data depending on received systematic information data, a first redundant data string, and a de-interleaved extrinsic information data string; a turbo-code interleaver for interleaving the reliability information data to obtain interleaved reliability information data; a second channel decoder for generating an extrinsic information data string and probability ratio data, the extrinsic information data string and the probability ratio data being generated depending on the interleaved reliability information data and a second redundant data string; a first turbo-code de-interleaver for de-interleaving the extrinsic information data string to obtain the de-interleaved extrinsic information data string, the de-interleaved extrinsic information data string being fed back to the first channel decoder; a second turbo-code de-interleaver for de-interleaving the probability ratio data to obtain de-interleaved probability ratio data, the second turbo-code de-interleaver outputting the de-interleaved probability ratio data; a threshold value decision circuit for generating estimated value data from the de-interleaved probability ratio data; a turbo-code coding circuit for turbo-coding the estimated value data to obtain turbo-coded estimated value data; and a comparison circuit that, depending upon a result of a comparison of the turbo-coded estimated value data with the turbo-coded received data, iteratively sets the at least one estimated channel parameter for weighting the turbo-coded received data.

In accordance with an added feature of the invention, there is provided, a data-separation device for separating the received data into the received systematic information data, and a plurality of redundant data strings which include the first redundant data string and the second redundant data string.

In accordance with an additional feature of the invention, the data-string separation device includes a multiplexer that outputs the first redundant data string to the first channel decoder and that outputs the second redundant data string to the second channel decoder.

In accordance with another feature of the invention, a buffer memory buffer stores the second redundant data string.

In accordance with a further feature of the invention, the turbo-code coding circuit includes RSC coders, puncturing devices configured downstream from the RSC coders, at least one turbo-code interleaving circuit, and a multiplexer.

In accordance with a further added feature of the invention, the estimated channel parameter is the signal-to-noise ratio.

With the foregoing and other objects in view there also is provided, in accordance with the invention, a decoding method for decoding turbo-coded received data. The method includes steps of: weighting turbo-coded received data with at least one estimated channel parameter; generating reliability information data depending on received systematic information data that is contained in the received data, a first redundant data string that is contained in the received data, and a sequence of extrinsic information data; interleaving the generated reliability information data; generating the extrinsic information data depending on interleaved reliability information data and a second redundant data string; generating probability ratio data depending on the interleaved reliability information data and the second redundant data string; de-interleaving the probability ratio data to obtain de-interleaved probability ratio data; forming an estimated value data string from the de-interleaved probability ratio data by performing a threshold value decision; turbo-coding the estimated value data string to obtain turbo-coded estimated value data; comparing the turbo-coded estimated value data with the turbo-coded received data; and iteratively setting the at least one estimated channel parameter to weight the turbo-coded received data depending on a comparison between the turbo-coded estimated data and the turbo-coded received data.

Other features which are considered as characteristic for the invention are set forth in the appended claims.

Although the invention is illustrated and described herein as embodied in a turbo-code decoder and a turbo-code decoding method with iterative channel parameter estimation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
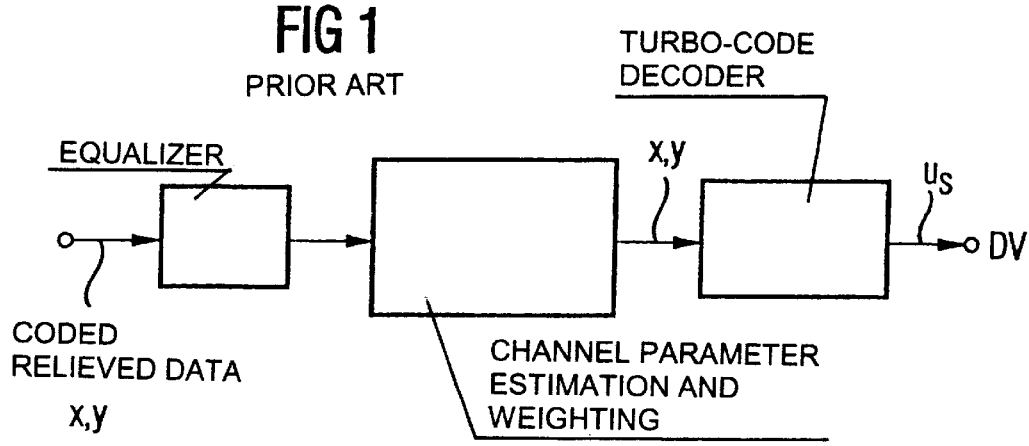
FIG. 1 shows a prior art turbo-code reception circuit.
Figure 2:
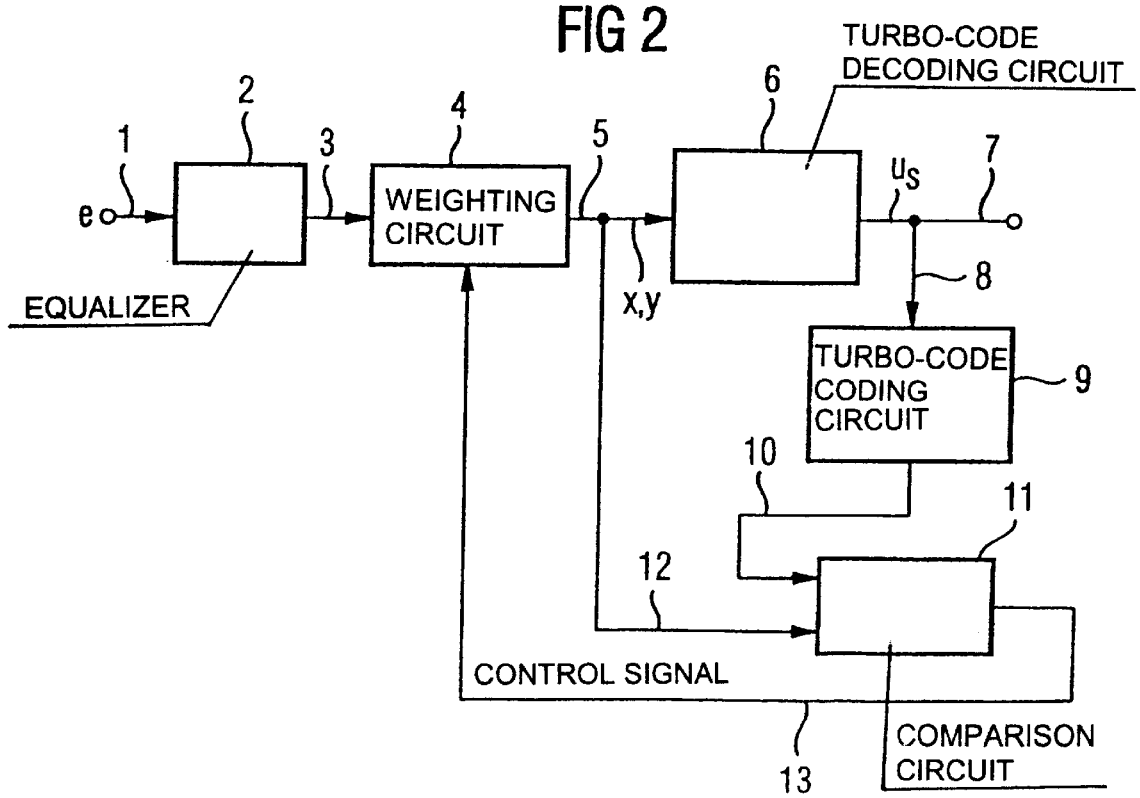
FIG. 2 shows an inventive turbo-code reception configuration.

Referring now to the figures of the drawing in detail and first, particularly, to FIG. 2 thereof, there is shown a turbo-coded received data string that has been, for example, received via an antenna and demodulated, and that is fed via a line 1 to an equalizer 2. The equalizer 2 equalizes the received data string and outputs it via an internal line 3 to a weighting circuit 4 to weight the turbo-coded received data with at least one estimated channel parameter. The weighted turbo-coded received data are forwarded via internal lines 5 into a turbo-code decoding circuit 6, in which they are initially separated by a data-separation circuit into a systematic information data string and a plurality of redundant data strings. The turbo-code decoding circuit is described in detail below with reference to FIG. 3. The turbo-code decoding circuit 6 feeds through the actual turbo-code decoding and outputs an estimated value data string via a line for further data processing within the receiver. The estimated value data string is additionally branched via a line 8 to a turbo-code coding circuit 9. The turbo-code coding circuit 9 is described in detail below with reference to FIG. 4. The turbo-code coding circuit 9 codes the estimated value data generated by the turbo-code decoding circuit 6 and outputs the estimated value data that has been turbo-coded in this way via an internal line 10 to a comparison circuit 11. The comparison circuit 11 additionally receives the original, weighted, turbo-coded received data, via a line 12, from the output of the weighting circuit 4. The comparison circuit 11 compares the weighted original, turbo-coded received data with the turbo-coded estimated value data that is present on the line 10. Depending on the result of the comparison, the comparison circuit 11 iteratively sets the channel parameters via a control line 13. The channel parameters that are used for weighting in the weighting circuit 4 are constantly readjusted in this way, so that they constantly and accurately reflect the channel condition, even in the event of severe fluctuations in the data transmission channel. The bit error ratio is thereby substantially reduced in the turbo-code decoder according to the invention. The SNR (signal-to-noise) ratio of the transmission channel is preferably used as the channel parameter.

Figure 3:
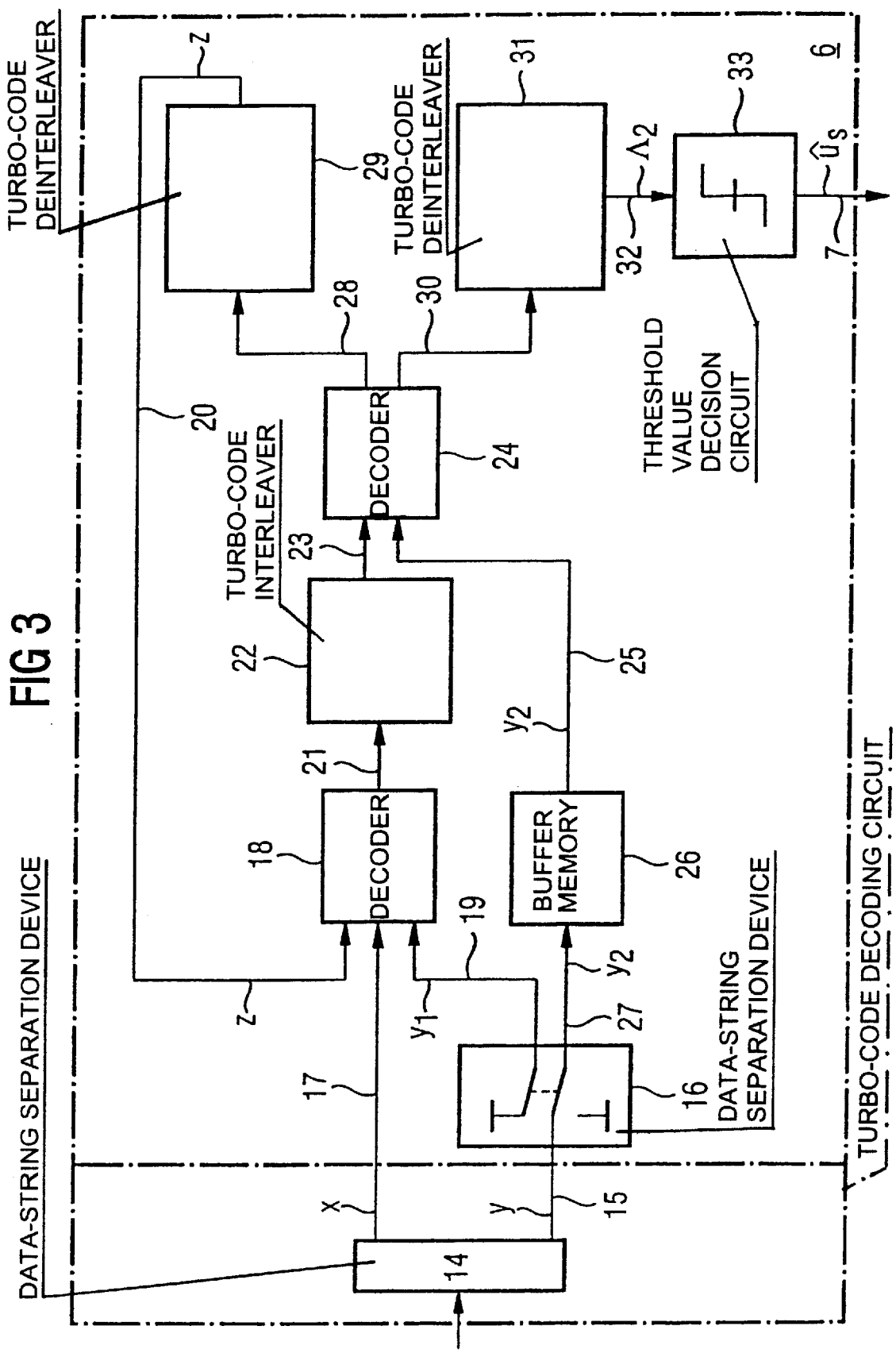
FIG. 3 shows the turbo-code decoding circuit, which is shown in FIG. 2, in greater detail.
Figure 4:
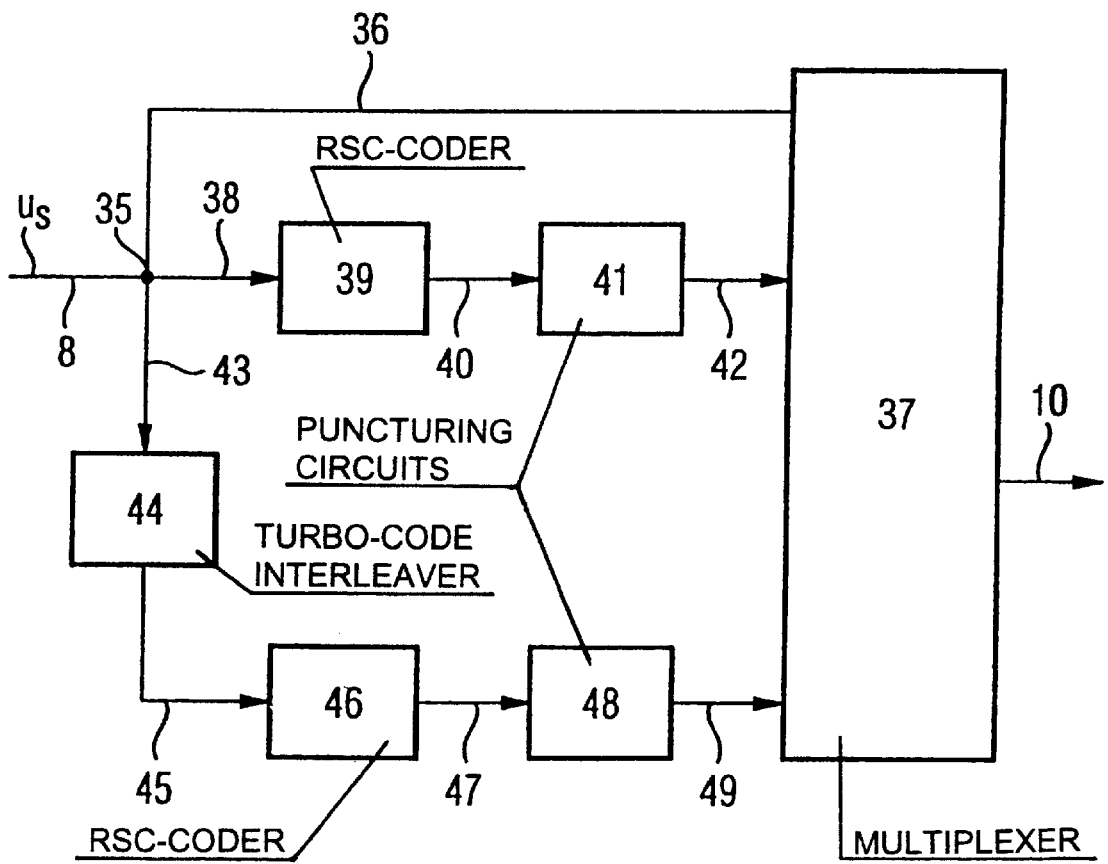
FIG. 4 shows the turbo-code coding circuit, which is shown in FIG. 2, in greater detail.

FIG. 3 shows, in detail, the turbo-code decoding circuit 6 shown in FIG. 2. A data string separation device circuit 14 separates the weighted, turbo-coded received data that is present on line 5 into a systematic information data string x and into redundant data y. The redundant data y are fed via a line 15 to a further data string separation device 16, for example, a multiplexer, which separates the redundant data, in the preferred embodiment shown in FIG. 3, into a first redundant data string and a second redundant data string through switchover. The systematic information data string x is forwarded via an internal line 17 to a first channel decoder 18. The first channel decoder 18 receives the first redundant data string $y_1$ via a line 19. Furthermore, the first channel decoder 18 receives an extrinsic information data string z via a feedback line 20. The extrinsic information data string z, which is similar to the systematic information data string x, is dependent only on systematic information within the received signal. The first channel decoder 18 generates a string of reliability information data depending on the received systematic information data x, the first redundant data string $y_1$ and the string of de-interleaved extrinsic information data z. The reliability information data generated in this way reflects the reliability of the received, turbo-coded data. The generated reliability information data are forwarded via a line 21 to a turbo-code interleaver 22 to interleave the generated reliability information data. The reliability information data interleaved in this way are fed via an internal line 23 to a second channel decoder 24. The second channel decoder 24 has another input that receives the second redundant data string $y_2$ via a line 25 from a buffer memory 26. The buffer memory 26 has an input connected, via a line 27, to the multiplexer 16.

The second channel decoder 24 generates the extrinsic information data string z, which it outputs, via an output line 28, to a turbo-code de-interleaver 29 for de-interleaving. The turbo-code de-interleaver 29 de-interleaves the extrinsic information data string formed by the second channel decoder 24 and feeds it, via the feedback line 20, back to the first channel decoder 18. The extrinsic information data string z formed in the second channel decoder 24 is formed depending on the interleaved reliability information data string present on the line 23 and the second redundant data string $y_2$ present on the line 25.

The second channel decoder 24 furthermore generates a sequence of probability ratio data, referred to as "Lock Likelihood Ratio Data" (LLR data) depending on the interleaved reliability information data that is present on line 23 and on the second redundant data string $y_2$ that is read from the buffer memory 26. The probability ratio data are output, via a line 30, to a turbo-code de-interleaver 31. The turbo-code de-interleaver 31 has an output connected, via a line 32, to a threshold value decision circuit 33. From the received probability ratio data or LLR data, the threshold value decision circuit 33 determines an estimated value data string, which is output via a line 7 for further data processing in the receiver. The LLR data provide measures for the reliability of a decision which has been made regarding the transmitted binary data symbols. Using the second channel decoder 24, to generate the extrinsic information data string z and the probability ratio data, depending on the interleaved reliability information data and the second redundant data string $Y_2$ are described in detail in P. Jung, "Analyse und Entwurf digitaler Mobilfunksysteme" [*Analysis and design of digital mobile radio systems*], Teubner Verlag, Stuttgart, under E.3 on pages 348–361.

The estimated values $U_s$ output by the threshold value decision circuit 33 are fed to the turbo-code coding circuit 9 shown in FIG. 2, via the lines 7, 8. The turbo-code coding circuit 9 is shown in detail in FIG. 4. The turbo-code coding circuit 9 corresponds to a conventional turbo coder. The estimated values $U_s$ are branched at a branch point 35 and are forwarded, via a line 36, to a first input of a multiplexer 37. The estimated values are furthermore fed, via an internal line 38, to an RSC coder 39. The RSC coder 39 generates redundant coded data that are forwarded, via a line 40, to a puncturing circuit 41. The puncturing circuit 41 punctures the data coded by the first RSC coder 39 and outputs the punctured data string, via a line 42, to a second input of the multiplexer 37.

The generated estimated data present at the branch node 35 are applied, via a line 43, to a turbo-code interleaver 44 having an output connected, via an internal line 45, to a second RSC coder 46. As a binary, recursive, systematic convolution coder, the RSC coder 46 carries out coding of the estimated data that is interleaved by the turbo-code interleaver 44 to generate a coded data string that is output, via a line 47, to a puncturing circuit 48 for puncturing. The puncturing circuit 48 has an output that is connected, via a line 49, to a third input of the multiplexer 37. The turbo-code coding circuit 9, in the turbo-code decoder 6 in the receiver, operates in exactly the same way as a turbo coder that is built into the transmitter. The precise mode of operation of a turbo coder of this type is described in P. Jung, "Analyse und Entwurf digitaler Mobilfunksysteme" [*Analysis and design of digital mobile radio systems*], under D.2 on pages 343–348. The multiplexer 37 of the turbo-coding circuit 9 generates and outputs a string of turbo-coded estimated value data that are fed via the line 10 to the comparison circuit 11 shown in FIG. 2. The comparison circuit 11 then compares the turbo-coded received data with the original turbo-coded received data present at the input of the turbo-code decoding circuit 6. Depending on the result of the comparison, the estimated channel parameters of the transmission channel are set or adjusted within the weighting circuit 4 in order to weight the turbo-coded received data. Since the channel parameters are determined after each decoding iteration using the decoded and then re-coded data bits or symbols, the channel condition is quickly adapted, even in the event of substantial changes in the transmission channel, so that the dynamic system response is significantly improved. A substantially lower bit error ratio can thereby be achieved by means of the turbo-code decoder according to the invention. The turbo-code decoder according to the invention is therefore eminently suitable for the mobile radio field, in particular for UMTS, IS-95/IS-2000, WCDMA and the like.

We claim:

1. A turbo-code decoder with iterative channel parameter estimation for decoding turbo-coded received data that includes systematic information data and redundant data, the turbo-code decoder, comprising:
   a weighting circuit for weighting turbo-coded received data with at least one estimated channel parameter;
   a first channel decoder for generating reliability information data depending on received systematic information data, a first redundant data string, and a de-interleaved extrinsic information data string;
   a turbo-code interleaver for interleaving the reliability information data to obtain interleaved reliability information data;
   a second channel decoder for generating an extrinsic information data string and probability ratio data, the extrinsic information data string and the probability ratio data being generated depending on the interleaved reliability information data and a second redundant data string;
   a first turbo-code de-interleaver for de-interleaving the extrinsic information data string to obtain the de-interleaved extrinsic information data string, the de-interleaved extrinsic information data string being fed back to said first channel decoder;
   a second turbo-code de-interleaver for de-interleaving the probability ratio data to obtain de-interleaved probability ratio data, said second turbo-code de-interleaver outputting the de-interleaved probability ratio data;
   a threshold value decision circuit for generating estimated value data from the de-interleaved probability ratio data;
   a turbo-code coding circuit for turbo-coding the estimated value data to obtain turbo-coded estimated value data; and
   a comparison circuit that, depending upon a result of a comparison of the turbo-coded estimated value data with the turbo-coded received data, iteratively sets the at least one estimated channel parameter for weighting the turbo-coded received data.

2. The turbo-code decoder according to claim 1, comprising: a data-separation device for separating the received data into the received systematic information data, the first redundant data string, and the second redundant data string.

3. The turbo-code decoder according to claim 2, wherein said data-string separation device includes a multiplexer that outputs the first redundant data string to said first channel decoder and the second redundant data string to said second channel decoder.

4. The turbo-code decoder according to claim 1, comprising: a buffer memory for buffer storing the second redundant data string.

5. The turbo-code decoder according to claim 1, wherein said turbo-code coding circuit includes RSC coders, puncturing devices configured downstream from said RSC coders, at least one turbo-code interleaving circuit, and a multiplexer.

6. The turbo-code decoder according to claim 1, wherein the estimated channel parameter is the signal-to-noise ratio.

7. A decoding method for decoding turbo-coded received data, which comprises:

weighting turbo-coded received data with at least one estimated channel parameter;

generating reliability information data depending on received systematic information data that is contained in the received data, a first redundant data string that is contained in the received data, and a sequence of extrinsic information data;

interleaving the generated reliability information data;

generating the extrinsic information data depending on interleaved reliability information data and a second redundant data string;

generating probability ratio data depending on the interleaved reliability information data and the second redundant data string;

de-interleaving the probability ratio data to obtain de-interleaved probability ratio data;

forming an estimated value data string from the de-interleaved probability ratio data by performing a threshold value decision;

turbo-coding the estimated value data string to obtain turbo-coded estimated value data;

comparing the turbo-coded estimated value data with the turbo-coded received data; and iteratively setting the at least one estimated channel parameter to weight the turbo-coded received data depending on a comparison between the turbo-coded estimated data and the turbo-coded received data.

* * * * *